Figure 1:
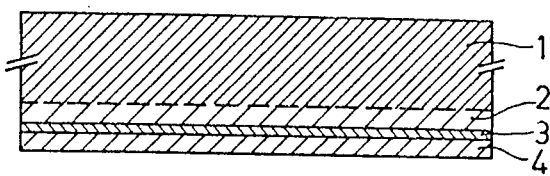

United States Patent [19]  [11] 4,189,342
Kock  [45] Feb. 19, 1980

[54] SEMICONDUCTOR DEVICE COMPRISING PROJECTING CONTACT LAYERS

[75] Inventor: Hendrikus G. Kock, Eindhoven, Netherlands

[73] Assignee: U.S. Philips Corporation, New York, N.Y.

[21] Appl. No.: 808,803

[22] Filed: Jun. 22, 1977

Related U.S. Application Data

[60] Division of Ser. No. 569,098, Apr. 17, 1975, abandoned, which is a continuation of Ser. No. 437,014, Jan. 28, 1974, abandoned, which is a continuation of Ser. No. 294,452, Oct. 2, 1972, abandoned.

[30] Foreign Application Priority Data

Oct. 7, 1971 [NL] Netherlands ............................ 7113746

[51] Int. Cl.² .......................................... H01L 21/308
[52] U.S. Cl. ..................................... 156/656; 29/578; 29/580; 156/649; 156/657; 156/662
[58] Field of Search ............... 156/649, 656, 657, 662; 357/13, 69, 15; 29/578, 580

[56] References Cited

U.S. PATENT DOCUMENTS

| 3,566,214 | 2/1971 | Usuda | 357/69 |
| 3,775,200 | 11/1973 | de Nobel et al. | 357/13 |
| 3,986,142 | 10/1976 | Kim | 357/13 |

FOREIGN PATENT DOCUMENTS 37-17725 10/1962 Japan .

OTHER PUBLICATIONS

*Handbook of Chemistry and Physics,* Chemical Rubber Co., Cleveland, Ohio, 48th Ed. (1967), pp. 179, 204, 219.

*Primary Examiner*—Jerome W. Massie
*Attorney, Agent, or Firm*—Thomas A. Briody; Paul R. Miller

[57] ABSTRACT

A microwave semiconductor device, for example, Gunn effect devices, avalanche diodes and varactors, having a mesa-like semiconductor body which is provided on both sides with respective grown metal contact layers. The upper side of the semiconductor body is provided with a beam lead which projects from the upper side. The metal contact layer of lower side of the semiconductor body is a grown heat sink or, as in the varactors, a beam lead.

3 Claims, 13 Drawing Figures

SEMICONDUCTOR DEVICE COMPRISING PROJECTING CONTACT LAYERS

The present application is a divisional of U.S. application Ser. No. 569,098, filed Apr. 17, 1975, now abandoned, which in turn is a continuation of U.S. application Ser. No. 437,014, filed Jan. 28, 1974, now abandoned, which in turn is a continuation of U.S. application Ser. No. 294,452, filed Oct. 2, 1972, now abandoned, and claims priority under Netherland Application No. 7113746, filed Oct. 7, 1971.

The invention relates to a method of manufacturing semiconductor devices comprising a semiconductor body having two substantially parallel oppositely located surfaces which are each provided with a conductive connection. In the invention the semiconductor body is formed by subjecting a monocrystalline semiconductor layer, on both sides of which a metallic layer is present, to a treatment to remove semiconductor material while using a mask, in which treatment a part of the semiconductor layer is removed from one of the sides of the semiconductor layer up to the opposite side.

Such methods in which the semiconductor body of the device is obtained from a semiconductor layer by removing parts thereof, for example by etching or back sputtering, are frequency used in semiconductor technology, in particular in the manufacture of devices for generating or amplifying microwaves.

German offenlegungsschrift No. 2,029,236, for example, described the manufacture of an avalanche diode of the metalsemiconductor type. In this case a metallic layer is first provided on one side of a layer-shaped semiconductor body and forms a rectifying metal-semiconductor junction with the adjacent semiconductor body. The same side of the semiconductor layer is then provided with a thick metal layer which ultimately serves as a cooling member. A thin metal layer in the form of a pattern of metal contacts is provided on the other side of the semiconductor layer. The other side is then provided with a mask consisting of a photosensitive lacquer, after which the greater part of the semiconductor layer is etched away down to the metal layer present on the oppositely located side, a number of separate mesa-like semiconductor bodies remaining below the masking pattern. The diodes are separated from each other by sawing the thick metal layer serving as a cooling member into pieces.

Important is inter alia that the diodes obtained in the above-described manner have a cooling member which is grown to the semiconductor body and is not connected, for example, by soldering. Actually these diodes are often very small; they have a diameter, for example of 100 $\mu$m or less. This means that the dissipation of the thermal energy produced during operation in the semiconductor body to the cooling member must occur over a very small surface, as a result of which high requirements must be imposed also on the thermal contact between the semiconductor body and the cooling member. By means of a grown layer, a junction between a semiconductor body and the cooling member is easily obtained which has good heat conducting properties, while with a soldered joint the thermal contact is effected often only over part of the available surface area.

The above-described avalanche diode is usually assembled by soldering the cooling member to a metal base plate and connecting a connection wire or a ribbon-shaped connection conductor to the metal contact on the other side by means of thermocompression bonding.

Notably the connection of a conductor to the metal contact in these small diodes is often a difficult process which requires accurate aligning and in which furthermore the required pressure for effecting a good thermocompression bond must be accurately adjusted because the small semiconductor body can otherwise easily be damaged.

It is an object of the invention to provide a method of making semiconductor devices having a semiconductor body which is provided on either side with an electric connection without it being necessary for the semiconductor body to be subjected to a mounting operation in which pressure and/or increase of temperature is used as in thermocompression bonding, alloying, soldering or ultrasonic welding.

The invention in inter alia bases on the recognition of the fact that the drawbacks associated with such mounting operations can be avoided by, producing during the manufacture and prior to the semiconductor body obtaining its ultimate shape and dimensions, an electric connection on either side thereof.

According to the invention, there is employed in a method of the type described in the preamble, formed by the metallic layer present on the one side, and, during the treatment to remove the semiconductor material, the part of the semiconductor layer present below this metallic layer is removed with the exception of the semiconductor body to be formed, at least one band-shaped part of the metallic layer projecting laterally beyond the semiconductor body, hereinafter termed projection, being obtained, said projection forming a connection conductor for the semiconductor body.

It is to be noted that a "metallic layer" is to be understood to mean within the scope of the present invention a conductive layer which may consist of a metal or an alloy or which is constructed entirely or only locally from several conductive layers of different compositions, for example, several metal layers.

When using the method according to the invention, semiconductor devices are obtained, in which, after the semiconductor body has obtained its ultimate shape, no electric connections need be provided on it, as a result of which alignment problems and connections having less favourable properties from an electric point of view or from the point of view of heat transport can be avoided.

It is to be noted that it is known per se to use in semiconductor devices projections for the electric connection, which are sometimes referred to as "beam leads". In that case, however, shaping the semiconductor body takes place from the oppositely located side of the semiconductor layer so that the oppositely located side of the ultimate semiconductor body has still to be connected, for example, by soldering it to an electrically conductive cooling member.

In the method according to the invention, however, both connections are provided prior to shaping of the semiconductor body in which, by using the metallic layer on one side of the semiconductor layer as a mask for shaping the semiconductor body, a connection is obtained on that side, the connection having one or more projections or beam leads.

A semiconductor layer is preferably used which is provided on either side with a grown metallic layer, the term "grown" being used in contrast with all those types of connections in which thermal energy and/or pressure is required. A grown layer can be obtained, for example, by vapor deposition in a vacuum, by sputtering or by chemical or electrochemical deposition from the gaseous or liquid phase.

In an important embodiment of the method according to the invention a semiconductor layer is used which is provided on one side with a metallic layer having a thickness of at most 2.5 μm and preferably approximately 1 μm. When such metallic layers are used, projections are obtained which have a great flexibility, which is of importance in the assembly.

In a further preferred embodiment of the method according to the invention a semiconductor layer is used in which the metallic layer on one side directly adjoins the semiconductor surface of the semiconductor layer, the mask having a first part the center of which coincides substantially with the centre of the semiconductor body to be formed, said first part furthermore comprising one or more band-shaped extensions, the treatment to remove material being continued until the part of the semiconductor layer covered by the extensions is removed and the first part of the mask projects on all sides beyond the formed semiconductor body over a distance which is at least equal to half the width of the band-shaped extensions.

This embodiment provides the desirable structure with a minimum of operations, the extensions of the metallic layer being simply liberated, for example, by underetching, to serve as projecting connection conductors.

In particular, when the extension used is too small, said embodiment results in structures in which the metallic layer can project comparatively far beyond the semiconductor material. For semiconductor devices which are used at very high frequencies, said projecting layer together with the metallic layer which is present on the oppositely located side and which constitutes, for example, a cooling member projecting beyond the semiconductor body, may constitute a parallel capacity which is so large that the electric behaviour of the semiconductor device is adversely influenced by it.

In those cases in which notably a small parallel capacity is desirable, a further embodiment of the method according to the invention may advantageously be used which is characterized in that a semiconductor layer is used in which the metallic layer on one side only locally adjoins the semiconductor surface of the semiconductor layer directly and for the remaining part is separated therefrom by an intermediate layer, the mask being formed by the part of the metallic layer which is in direct contact with the semiconductor surface, said part comprising one or more band-shaped extensions present on the intermediate layer, the intermediate layer being first removed entirely prior to the treatment in which the semiconductor material is removed.

In this manner it is achieved that the projections of the metallic layer are already free before the etching treatment of the semiconductor layer is started, as a result of which the underetching and hence the omnilateral projection of the metallic layer can substantially be restricted to a distance which corresponds to the thickness of the semiconductor layer used.

The invention furthermore relates to semiconductor devices manufactured by using the method according to the invention.

The invention also relates in particular to semiconductor devices, for example, for generating and/or amplifying microwaves, which devices show a semiconductor body having a first and an appositely located second surface, said two substantially parallel surfaces adjoining substantially entirely a first and a second metallisation, respectively, for contacting purpose, said metallisations projecting laterally beyond the semiconductor body substantially parallel to the two surfaces, the surface of the part of the first metallisation adjoining the semiconductor body being smaller than the corresponding surface of the second metallisation. According to the invention, such semiconductor devices are characterized in that the first metallisation has a band-shaped projection at least in one direction.

In these devices which in most of the cases have a mesa-like semiconductor body, it is of advantage that the projecting connection conductor or "beam lead" is present on the side having the smaller surface. The thermal energy generated in the semiconductor body during operation may then be dissipated via the larger surface to a base plate and/or a cooling member.

Also in connection with said heat dissipation, the second metallisation preferably has a thickness which is at least equal to the thickness of the semiconductor body measured between the two metallisation. Said metallisation may consequently also serve easily to increase the handleability during manufacture. As a matter of fact, the semiconductor body itself usually is small and has, for example, a thickness of 10 to 50 μm and a diameter of, for example, 100 μm or less. The second metallisation has, for example, an area of 600 μm × 600 μm and a thickness which is preferably larger than 50 μm.

In an important embodiment of the semiconductor device according to the invention, at least one semiconductor junction extends in the semiconductor body substantially parallel to the said metallisation surfaces between two semiconductor regions having mutually different electric properties, the distance from said junction to the second metallisation being small relative to the distance between said junction and the first metallisation.

As a matter of fact, the heat generation during operation will in most of the cases occur in the vinicity of said junction. In a device in which the negative-resistance bulk effect is used, for example, Gunn effect oscillators and devices operated in the LSA mode, a thin-ohmic layer may adjoin, for example, the second metallisation, the maining part of the semiconductor body being of the same conductivity type, but having a much lower resistivity than the thin high-ohmic layer. In avalanche diodes the semiconductor body usually has a thin high-ohmic layer, while in connection with the desirable low series resistance the remaining part is low-ohmic. In diodes of the Schottky type the rectifying junction is preferably present between the second metallisation and the high-ohmic layer, while in diodes having a p−n junction a zone of the opposite conductivity type extends in the high-ohmic layer from the semiconductor surface adjoining the second metallisation.

In the said diodes it is furthermore of advantage that the structure of the semiconductor body is mesa-like, the rectifying junction being present on the side having the larger surface. This structure prevents in many cases that the breakdown of the junction occurs preferably at the edge of the body. Notably with a bevel of the semiconductor body in the direction stated the breakdown voltage of the junction in the bulk is smaller than or equal to that at the edge.

In connection with the assembly, the band-shaped projection preferably is longer than the projecting part of the second metallisation, so that the connection conductor, at least in the direction in which it extends, projects farther beyond the semiconductor body than the second metallisation.

The semiconductor device can be assembled by securing the second metallisation serving as a cooling member to a second cooling member, for example, a conductive plate. On this conductive base plate an insulating body may be secured beside the semiconductor body, for example, a ring or a block of quartz which is metallised on two oppositely located sides. The insulating member preferably projects above the semiconductor body. The projecting connection conductor may be secured to the metallised upper side of the insulating member, for example, by means of thermocompression bonding. The further electric connection may then be obtained, for example, by pressing a conductive pin on the upper side of the insulating member. Since the insulating member projects above the semiconductor body, the latter is protected from damage by the connection pin which usually is much larger.

Preferably the second metallisation also forms the base plate on which the insulating member is secured, as a result of which the device is particularly compact.

A further embodiment of the semiconductor device according to the invention is characterized in that the second metallisation also has one or more band-shaped projections which project beyond the semiconductor body.

This embodiment is particularly suitable for capacity diodes. The usual capacity diodes are planar diodes in which the rectifying junction is curved at the edges as is the case with any planar structure. In many cases, said curvature of the junction is decisive of the breakdown voltage, as a result of which said breakdown voltage is lower than is possible on the basis of only the resistivity of the semiconductor material used.

The invention provides diodes having a flat junction which, in particular when the semiconductor body is slightly bevelled and the part of the semiconductor body adjoining the smaller surface of the mesa is n-type conductive, show a breakdown voltage which corresponds to the bulk breakdown voltage determined by the doping concentration and which moreover are provided on both oppositely located sides with projecting connection conductors or beam leads which are particularly desirable for very high frequencies.

Said capacity diodes furthermore have comparatively little series resistance because at the same desirable breakdown voltage the resistivity of the starting material in a mesa-like body having a flat junction can be chosen to be lower than in the usual diodes which have a curved junction.

The invention will now be described in greater detail with reference to a few embodiments and the accompanying drawing, in which FIGS. 1 to 7 are diagrammatic sectional views of a first embodiment of the semiconductor device according to the invention in various stages of the manufacture while using the method according to the invention.

Figure 8:
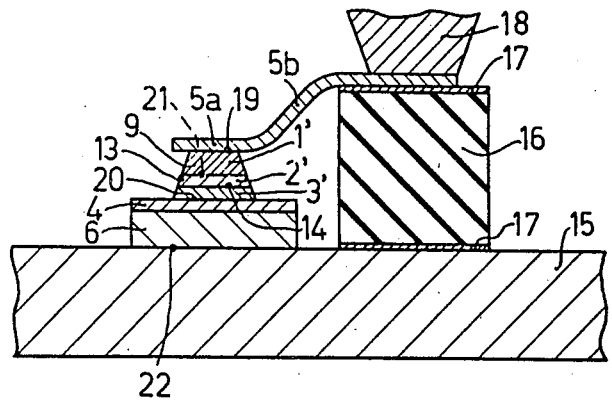
Figure 9:
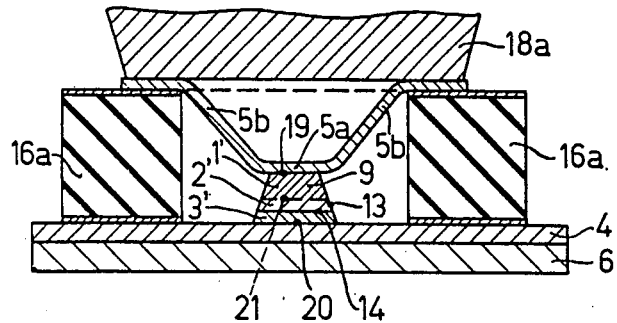
Figure 10:
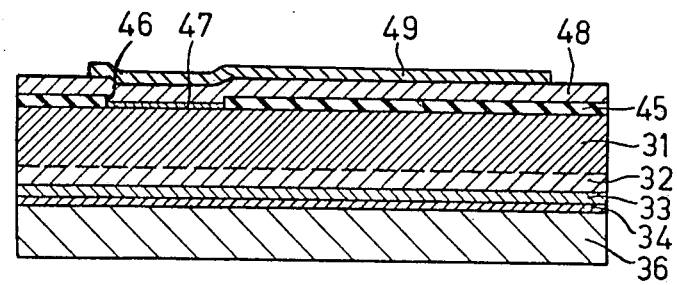
Figure 11:
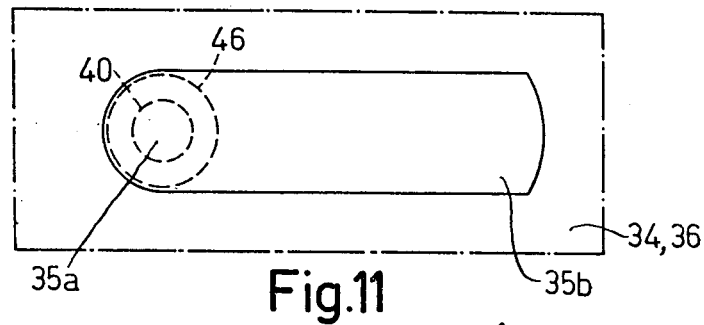
Figure 12:
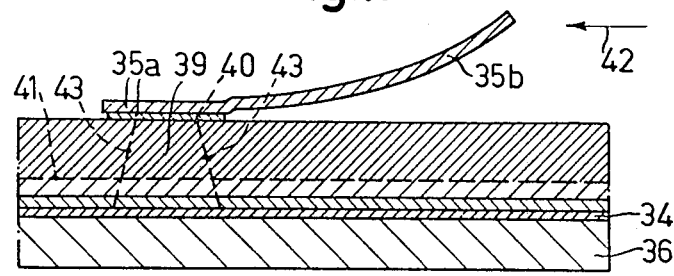
Figure 13:
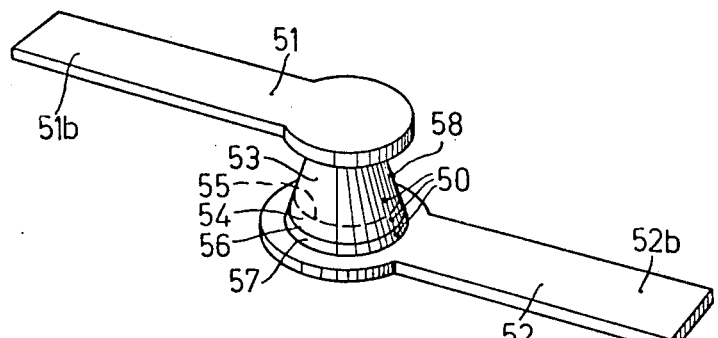

FIG. 8 is a diagrammatic cross-sectional view of the manufactured semiconductor device after assembly, FIG. 9 is a diagrammatic cross-sectional view of a second embodiment of the semiconductor device according to the invention, FIGS. 10, 11 and 12 are diagrammatic sectional views of a further embodiment of the semiconductor device according to the invention in various stages of the manufacture while using a second embodiment of the method according to the invention, FIG. 13 is a diagrammatic view of again another embodiment of the semiconductor device according to the invention.

The first example to be described relates to the manufacture of an avalanche diode. Starting material is a monocrystalline semiconductor body, for example of silicon, having a thickness of, for example, approximately 250 μm. This body consists in the present case of an n-type substrate 1 having a resistivity of approximately 0.01 ohm.cm., on which an n-type epitaxial layer 2 is provided having a resistivity of approximately 0.25 ohm.cm. and a thickness of approximately 2.5 μm.

After diffusing in the epitaxial layer a p-type layer 3, for example, at approximately 1100° C. with a surface concentration of approximately $10^{20}$ boron atoms/cm$^3$ and a thickness of approximately 0.5 μm, a metallisation 4 which may consist, for example, of a thin layer of approximately 500 Å Cr, Ti or Pd and a layer of Au, Pt, or W which is approximately 1 μm thick is provided on the p-type surface.

Figure 2:
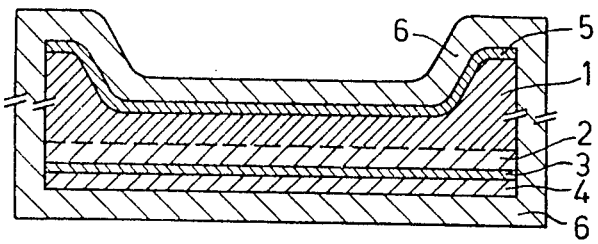
Figure 3:
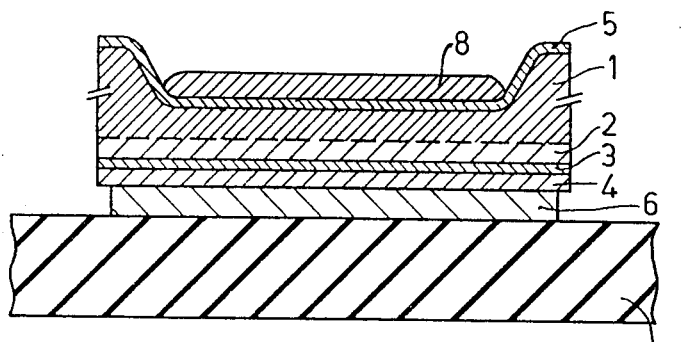
Figure 4:
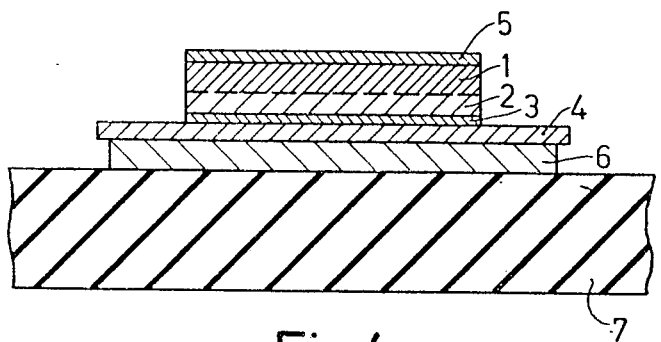

The body is then provided with a masking layer which does not cover the oppositely located n-side, except the outer edge, and fully covers the remaining part of the surface. The thickness of the central part of the body is reduced to, for example, approximately 40 μm from the n-side by means of an etching treatment (FIG. 2).

A metallisation 5 which, for example, also consists of a thin Cr layer and a thicker Au-layer is then provided on the etched side, after which a silver layer 6 is grown with a thickness of 50-100 μm in an Ag solution.

After securing the body to a support 7 (FIG. 3) of, for example quartz, silver is etched until only the part of the silver layer 6 between the semiconductor body and the support 7 remains. The central part of the oppositely located side is provided with a masking layer 8 and the thick edges of the semiconductor body are removed by etching. The result is a comparatively thin monocrystalline semiconductor layer 1, 2, 3, 4 (see FIG. 4) on one side of which the metallic layer 5 is present and on the other side of which the metallic layer 4, 6 is present, in which in this case both metallic layers are grown to the semiconductor layer.

For clarity it is to be noted that such a semiconductor layer provided with metallisation can also be obtained in a different manner and that the above-described method in itself is not of essential importance for the present invention.

Figure 5:
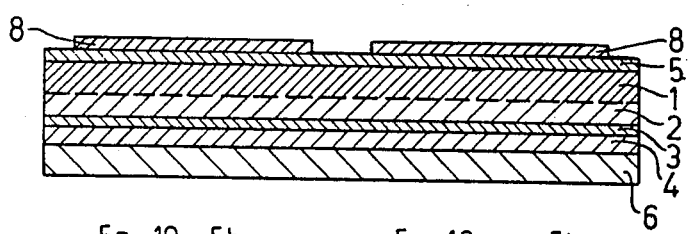
Figure 6:
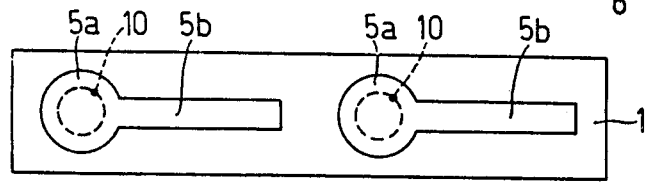

A layer of photosensitive lacquer is then provided on the metallisation 5, parts 8 of which layer are are obtained in the usual manner after exposure and development serve as a mask in the local removal of the metallisation 5. FIG. 5 is a cross-sectional view of a small part of the semiconductor layer 1 to 6 with two parts 8 of the lacquer masking layer at the top lacquer. After the local removal of the conductive layer 5, a metallic layer remains which consists of a pattern of parts 5a,b and is shown in the plan view of FIG. 6.

Figure 7:
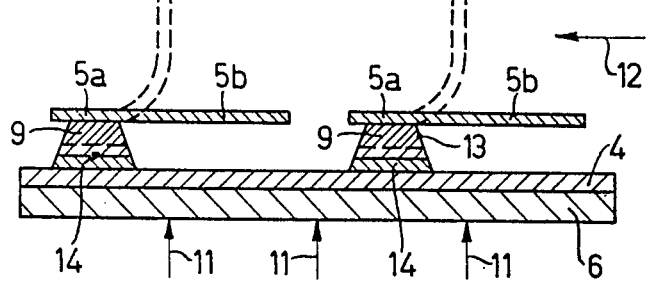

These parts 5a,b constitute the mask which is used during the subsequent removal of the greater part of the semiconductor layer to obtain individual semiconductor bodies (FIG. 7). This removal is continued until inter alia the part of the semiconductor layer covered by the band-shaped extension 5b of the metallic layer 5a,b is removed so that the extension 5b freely projects laterally beyond the semiconductor body 9. The part 5a of the mask also projects beyond the body, as is shown diagrammatically in FIG. 6 in which the broken line 10 is the boundary of the semiconductor surface adjoining the metallisation.

The part 5a of the mask has a diameter of, for example, approximately 200 μm and the extension 5b has a length of, for example, 400 μm and a width of approximately 100 μm. The semiconductor bodies 9 have a diameter of, for example, approximately 90 μm. The angle of inclination of the side surface 13 of the mesa-like bodies 9 depends inter alia upon the extent of underetching below the part 5a of the mask. According as underetching is further continued, the angle between the side surface and the two parallel major surfaces deviates less from 90°. It is to be noted that the effect in view of an increased breakdown voltage is already achieved also with a very small deviation.

The diodes can be separated from each other by severing the metallisation 4, 6, for example, in the places denoted by the arrows 11 by cleaving, sawing or cutting, in which the projections 5b may previously be provided, if desirable, in the position shown in broken lines in FIG. 7 which can simply be achieved, for example, due to the great flexibility of the thin projections, by means of a gas current in the direction indicated by the arrow 12, for example, by blowing with compressed air.

The separated diodes may then be connected, for example by soldering, to an electrically conductive base plate 15 (FIG. 8), for example, of silver, which in this case serves as a second cooling member. To this cooling member 15 may furthermore be secured, for example, a quartz block 16 having dimensions of approximately 150 μm×150μm×150 μm, which block in the present example is provided on two oppositely located sides with a conductive layer 17 which may consist of a chromium layer having a thickness of 0.1 μm, which serves as an adhering layer and, for example, a layer of gold having a thickness of approximately 1 μm.

The projection 5b may be connected, for example, with a thermocompression bond to the oppositely located metallised upper side of the block 16. It is of importance that the block 16 project above the semiconductor body 9, as a result of which the possibility of damage to the body 9 upon further contacting by means of a pin 18 shown diagrammatically in FIG. 8 which presses on the outer side of the block 16, is small. The projection 5b must be sufficiently flexible to be securable in the bent shape shown without the semiconductor body and/or the contact between the semiconductor body and the metallisation being damaged. The thickness of the projection 5b is therefore preferably at most 2.5 μm, while very good results are obtained with projections having a thickness of approximately 1 μm.

The resulting semiconductor device is an Impatt avalanche diode suitable for use at frequencies of approximately 30 GHz. This diode has a semiconductor body 9 with a first and an oppositely located second surface 19 and 20, respectively, which two substantially parallel surfaces 19 and 20 substantially entirely adjoin a first and a second metallisation 5a,b and 4, 6, respectively, for contacting purpose, which metallisations 5a, b and 4, 6 project laterally beyond the semiconductor body 9 substantially parallel to the two surfaces 19 and 20, the surface of the part of the first metallisation 5a, b which adjoins the semiconductor body being smaller than the corresponding surface of the second metallisation 4, 6.

According to the invention, the first metallisation 5a, b has a band-shaped projection 5b in one direction or, as is shown in the sectional view of FIG. 9, in several directions, which projection serves as a connection conductor for the semiconductor body.

In the semiconductor body 9 substantially parallel to the two metallised surfaces 19 and 20 a semiconductor junction 21 extends between the semiconductor regions 1' and 2' having mutually different electrical properties. The distance between the junction 21 and the second metallisation 4, 6 at the surface 20 is small relative to the distance between the junction 21 and the first metallisation 5a, b at the surface 19. In the present example the junction 21 is an n−n+ junction, that is to say a junction between two semiconductor regions of the same conductivity type but of a different doping concentration.

In avalanche diodes and, for example, also in devices in which the negative resistance bulk effect is used, for example, Gunn effect oscillators or devices operated in the LSA mode, the heat generation during operation will usually take place in the thinner semiconductor layer, so in the layer 2', which in that case usually has a higher resistivity than the thicker layer 1'. In the device described, said generated heat need not be dissipated via the projection 5b but said heat may flow away via a larger contact surface to the metallisation 4, 6 which is present much closer to the place of the heat generation and which moreover can be constructed to be considerably thicker and longer than the projections 5b. Because the metallisation 4, 6 is grown and is therefore in thermal contact with the semiconductor body 9 evenly and uniformly throughout the surface 20, a relatively good heat transfer will occur between the semiconductor body 9 and the metallisation 4, 6, which is important in view of the small area of the surface 20. The heat flow in the metallisation 4, 6 will spread approximately at an angle of 45° to the normal. In connection herewith the thickness of the second metallisation 4, 6 is preferably at least equal to the thickness of the semiconductor body 9 measured between the two metallisation 5a, b and 4,6, the metallisation 4,6 being at any rate thick as compared with projection 5b. In the present example the thickness of the semiconductor body 9 is approximately 40 μm and the thickness of the metallisation 50–100 μm. When the semiconductor body 9 has a diameter of approximately 100 μm, in which said diameter will usually be smaller according as the thickness is smaller, the surface, with a 50 μm thick metallisation 4,6, across which the heat transfer takes place mainly at the interface 22 between the metallisation 4,6 and the second cooling member 15, is already four times as large as the surface area of the surface 20. With this larger area across which the heat transfer takes place, the requirements of uniform thermal contact on the junction at the interface 22 can be relaxed. In that case the metallisation 4,6 may be soldered to the cooling member 15 without any objections.

It will be obvious from the above that thickness of the metallisation 4,6 is also decisive of the minimum desirable dimensions in the lateral direction. In practice, the lateral dimensions of the metallisation will exceed said minimum values already in most of the cases in connection with the desirable handleability of the device during the manufacture. In the present example, the metallisation 4,6 of the diode shown in FIG. 8 has a length and a width of approximately 400 μm.

In the example shown in FIG. 8 the projection 5b serving as a connection conductor projects in the direction in which it extends farther beyond the semiconductor body than the second metallisation 4,6, and the semiconductor body 9 and the insulation member 16 are both secured beside each other on the base plate 15.

FIG. 9 shows a variation of the diode shown in FIG. 8 in which corresponding parts referred to by the same reference numerals. This diode shows two beam leads or projections 5b which extend in opposite directions, each of which beam leads may be secured to a quartz block 16 or as shown in FIG. 9, for example, an annular insulating member 16a may also be used. The contact pin 18a may then bear on both blocks or on the ring as is shown.

Furthermore, in order to obtain a particularly compact structure, the insulating member 16a as in this case directly secured to the metallisation 4, 6 so that said metallisation also constitutes the base plate of the device.

In the above-described manner of manufacturing, the metallic layer 5a,b which is used as a mask directly adjoins the semiconductor surface at one side of the semiconductor layer 1,2,3,4. The mask has a first portion 5a of which the centre substantially coincides with that of the semiconductor body 9 to be formed, while said first part 5a furthermore has a band-shaped extension 5b. Said extension 5b is liberated by entirely removing the material from the semiconductor layer below the extension, as a result of which the first part 5a also projects (on all sides) beyond the body 9 formed over a distance which is at least equal to half the width of the extension 5b.

This mode of manufacturing in which the beam leads are simply liberated by underetching of the semiconductor material may give rise to an undesirably large parallel capacity in devices for use at very high frequencies as a result of the omnilateral projection of the part 5a. The projecting edge of the part 5a actually constitutes together with the projecting metallisation 4,6 a capacity which extends in parallel with the semiconductor device.

In a variation of the method which will be described with reference to FIG. 10, 11 and 12 the parallel capacity of the resulting devices may be considerably smaller. In this variation a semiconductor layer is again used having a substrate 31, an epitaxial layer 32 of the same conductivity type as the substrate 31 and a layer 33 of the opposite conductivity type, a metallisation being present on both sides. As in the preceding embodiment, the metallisation on one side is comparatively thick and constructed in the form of two layers 34 and 36. On the other side, however, the metallisation is obtained by first providing on the semiconductor surface an intermediate layer 45 having apertures or windows 46 therein in the desirable places. Said intermediate layer 45 must be selectively etchable relative to the semiconductor material and the materials of the metallisation used on said side and may consist, for example, of copper or, as in the present example, of silicon dioxide.

A conductive layer 47 is provided in the aperture 46, for example, by vapour deposition or sputtering and then etching a pattern in a layer of palladium. A conductive layer 48 is then again provided, this time of a material which readily adheres to the conductive layer 47 and preferably less favourably to the intermediate layer 45, for example gold. A lacquer pattern 49 is provide on said gold layer 48 in the form of the metallisation desired on said side. After etching the layer of gold, a metallic layer shown in FIG. 11 remains, for example, in the form of a band-shaped strip rounded on one or both ends and having a portion 35a adjoining the semiconductor surface in the window 46 and a portion 35b extending over the intermediate layer 45 on the window 46.

The intermediate layer 45 is then removed entirely as a result of which the portion 35b of the metallisation freely floats above the semiconductor surface. If required, the projection 35b may be bent in this case also by blocking in the direction denoted by the arrow 42.

In the subsequent treatment to remove semiconductor material, the portion 35a of the metallisation serves as the mask proper, as a result of which in shaping the semiconductor body 39 (FIG. 12) the bounding side plane of which is indicated in broken lines 43, the omnilateral projection of the portion 35a resulting from underetching can be restricted to a distance corresponding to the thickness of the original semiconductor layer 31 to 34. In the case of thin semiconductor layers of, for example, 20 μm, a beam lead for example having a width of approximately 100 μm may be obtained, the distance between the edge 40 of the semiconductor surface adjoining the metallisation 35a and the boundary of the onmilateral projecting portion 35a given by the edge 46 of the original window being restrictable to approximately 20 μm. The diameter of the semiconductor body 39 is then, for example, approximately 60 μm.

Furthermore it is of importance that in this embodiment the projection 35b consists of a homogeneously composed layer and not of two layers of different compositions. As a result of this the occurrence of thermal stresses as a result of a difference in coefficients of thermal expansion in the beam lead is prevented.

The resulting diodes may be separated from each other and mounted in the above-described manner.

It will be obvious that avalanche diodes with a Schottky junction can be manufactured in a corresponding manner. In that case the layer 3 or 33 of the opposite conductivity type and the p—n junction 14 are lacking. The rectifying Schottky junction is preferably present between the semiconductor body 9 and 39, respectively, and the metallisation 4,6 and 34, 36, respectively, so on the wide side of the mesa-like semiconductor body. Such a Schottky junction may be obtained, for example, by the use of a thin layer of Pt between the semiconductor surface and the metallisation 4,6 and 34, 36, respectively.

In devices for use of the negative resistance bulk effect, only a junction 21 and 41, respectively, between a highohmic and a low-ohmic part of the same conductivity type is sufficient and a rectifying junction may be omitted altogether.

A further embodiment of the semiconductor device according to the invention is shown in FIG. 13. This embodiment also relates to a device having a semiconductor body 50 with two oppositely located substantially parallel surfaces which are each provided with a metallisation 51 and 52, respectively. Both the first 51 and the second metallisation 52 have a band-shaped projection 51b and 52b, respectively. Both sides of the semiconductor body are thus provided with a beam lead for contacting purposes.

This structure is particularly suitable for capacity diodes for very high frequencies. The semiconductor body of the diode, for example, has an n+region 53 with a high doping concentration and an n-type layer 54 having a low doping concentration grown epitaxially thereon. The junction 55 between the regions 53 and the layer 54 extends substantially parallel to the two metallised surfaces of the body 50. The n-type layer 54 constitutes a p—n junction 56 with a p-type layer 57 which is obtained, for example, by diffusion or ion implantation or is grown epitaxially. The junction 56 also extends parallel to the metallised surfaces. The p-type layer 57 adjoins the metallisation 52.

In contrast with the known capacity diodes which are usually of a planar construction, this diode has a mesa-like semiconductor body. The higher doped of the two layers 54 and 57 forming the p—n junction 56, namely the layer 57, adjoins the metallisation surface with the larger surface area, so the wide side of the mesa-like body, while the lower doped n-type layer 54 extends between the p+n junction 56 and the metallised surface with the smaller surface area. This means that the side surface 58 of the body 50 is bevelled in a direction which promotes that upon reaching the breakdown voltage the flat p—n junction 56 breaks down uniformly throughout its surface instead of breakdown occurring preferably at the area where the junction 56 merges at the side surface 58. As a result of this, the breakdown voltage of the diode with given doping concentrations has a comparatively high value which is considerably higher than in planar capacity diodes, in which the breakdown voltage is frequently determined by the curvature at the edge of the p—n junction. In other words with breakdown voltage remaining the same, a higher doping concentration may be used at the high ohmic n-type side of the p—n junction in a diode according to the invention than in the known planar capacity diodes, as a result of which the series resistance of the diode may be lower.

In addition to the lower series resistance, the capacity diode or varactor according to the invention also has the beam leads desirable for the electric connection which actually have the small inductance which is required for use at very high frequencies and which moreover are particularly suitable for direct mounting in circuits constructed in strip-line technology.

The capacity diode described may be used, for example, for tuning Gunn effect oscillators which may have, for example, a frequency of approximately 10 GHz.

Furthermore a capacity diode described may substantially entirely be manufactured in the manner as described with reference to FIGS. 1 to 7 for an avalanche diode, on the understanding that the starting material is a semiconductor body of which the doping concentrations are adapted in known manner to the desirable capacity-voltage characteristic of the varactor and the growing of the thick silver layer 6 is replaced by providing the metallisation 4 in the desirable pattern. Afterwards, upon providing a pattern in the metallisation 5, alignment must be carried out on the pattern of the metallisation 4, which may be carried out, for example, by means of infrared light for which the thin silicon layer is substantially transparent. Alignment may also be carried out on the patterned part of the metallisation 4 present on the support 7 beside the thin semiconductor layer after etching away the thick edge of the original semiconductor body.

It will be obvious that the invention is not restricted to the embodiments described but that many variations are possible to those skilled in the art without departing from the scope of this invention. For example, other semiconductor materials may be used, for example, germanium or $A^{III}B^V$ compounds, in which notably for devices in which the negative resistance bulk effect is used, GaAs has to be considered in particular. Furthermore when using GaAs in the metallisation 4, a thicker gold layer of, for example, approximately 10 μm is preferably used. Other suitable conductive materials for the various metallic layers may also be used, in which the chosen materials may be dependent, for example, upon the semiconductor materials used. For example, instead of the metallisations consisting of chromium and gold, conductive contacts of platinum silicide covered with successively approximately 500 Å titanium, approximately 2000 Å platinum and approximately 1 μm gold may be used. In avalanche diodes the various doping concentrations and the concentration profile may furthermore be adapted in the usual manner to the desirable operating frequency and of course the same applies to the capacity diodes. The avalanche diodes and negative resistance bulk effect devices described and whether or not provided with a protective layer of lacquer may be incorporated directly in a microwave circuit or first be provided with a conventional envelope.

The patterns desirable for the metallisations 5a, b, 35a, b, 51a,b and 52a, b may be obtained in another manner than that described, for example, by means of back sputtering instead of etching. In the method described with reference to FIGS. 10, 11 and 12 the intermediate layer 45 may also be omitted if for the conductive layer 48 a material is used such as gold which readily adheres to the palladium layer 47 and poorly adheres to the semiconductor surface. Upon etching the semiconductor material, underetching rapidly occurs below the poorly adhering gold. The etching treatment may be interrupted after a short period of time to end the underetched projections with a gas stream as described above and then continued until the semiconductor layer is etched through. In this case also the underetching of the part 35a remains restricted.

Finally, in addition to a p—n diode or a Schottky diode, the semiconductor device may also be, for example, a pin diode and the semiconductor body may also comprise several similar semiconductor junctions, for example two p—n junctions.

What is claimed is:

1. A method of manufacturing a semiconductor device comprising a semiconductor body having two substantially parallel oppositely located surfaces which are provided with a conductive connection, said method comprising the steps of providing a monocrystalline semiconductor layer provided with a metallic layer on both sides, said metallic layer on one side only locally adjoining directly the surface of the semiconductor and for the remainder being separated from the surface of the semiconductor layer by an intermediate layer with the metallic layer on said one side having one or more band shaped extensions present on the intermediate layer, entirely removing the intermediate layer prior to shaping the semiconductor layer, shaping the semiconductor body by subjecting the said semiconductor layer to a treatment to remove the semiconductor material from said one of the sides up to the oppositely located side while using a mask, said mask being formed by the part of the metallic layer on said one side directly present on the semiconductor layer surface, such that during the semiconductor material removal the part of the semiconductor layer present below said metallic layer is removed with the exception of the semiconductor body to be formed and at least a band-shaped part of the metallic layer projects laterally beyond the semiconductor body to form a projection which constitutes a connection conductor for said semiconductor body.

2. A method as in claim 1, wherein said metallic layer is grown on both sides of said semiconductor layer.

3. A method as in claim 1, wherein the metallic layer on said one side has a thickness of at most 2.5 μm.

* * * * *